United States Patent [19]

Worsham

[11] 4,249,846
[45] Feb. 10, 1981

[54] ROTARY VACUUM SEAL FOR A WAFER TRANSPORT SYSTEM

[75] Inventor: Daniel Worsham, San Jose, Calif.

[73] Assignee: Pacific Western Systems, Inc., Mountain View, Calif.

[21] Appl. No.: 971,209

[22] Filed: Dec. 20, 1978

[51] Int. Cl.³ ............................................. C23C 13/08
[52] U.S. Cl. ............................... 414/217; 277/237 R; 277/DIG. 7
[58] Field of Search .......................... 414/217; 34/242; 277/237 R, DIG. 7

[56] References Cited

U.S. PATENT DOCUMENTS

| | | | |
|---|---|---|---|
| 3,170,576 | 2/1965 | Frank | 414/217 |
| 3,334,908 | 8/1967 | Starbuck | 277/237 X |

Primary Examiner—Robert G. Sheridan
Attorney, Agent, or Firm—Harry E. Aine; Harvey G. Lowhurst

[57] ABSTRACT

In a rotary vacuum sealed wafer transport system for transporting semiconductive wafers between ambient atmosphere and subatmospheric pressure within a wafer processing station, the wafers, on a conveyor web pass through a slot in the vacuum chamber of the processing station. The evacuable envelope of the processing station has an external concave face portion intersecting with a generally planar face portion with the slot being positioned generally at the intersection of the concave and planar face portions. A deformable elastic roller, preferably pneumatically inflated, is disposed for rolling sealing engagement with the conveyor web and wafer and for wiping sealing engagement with portions of the planar and concave faces to provide a gas tight seal of the slot while permitting passage of the conveyor web with the wafers thereon into the evacuated wafer processing station. In a preferred embodiment, the conveyor web passes through input and output slots with pneumatic rollers sealing the pair of slots. In the latter case, the rollers are preferably driven in unison to prevent any wiping action of the roller on the surface of the wafer. In an alternative embodiment, the conveyor web is omitted.

9 Claims, 1 Drawing Figure

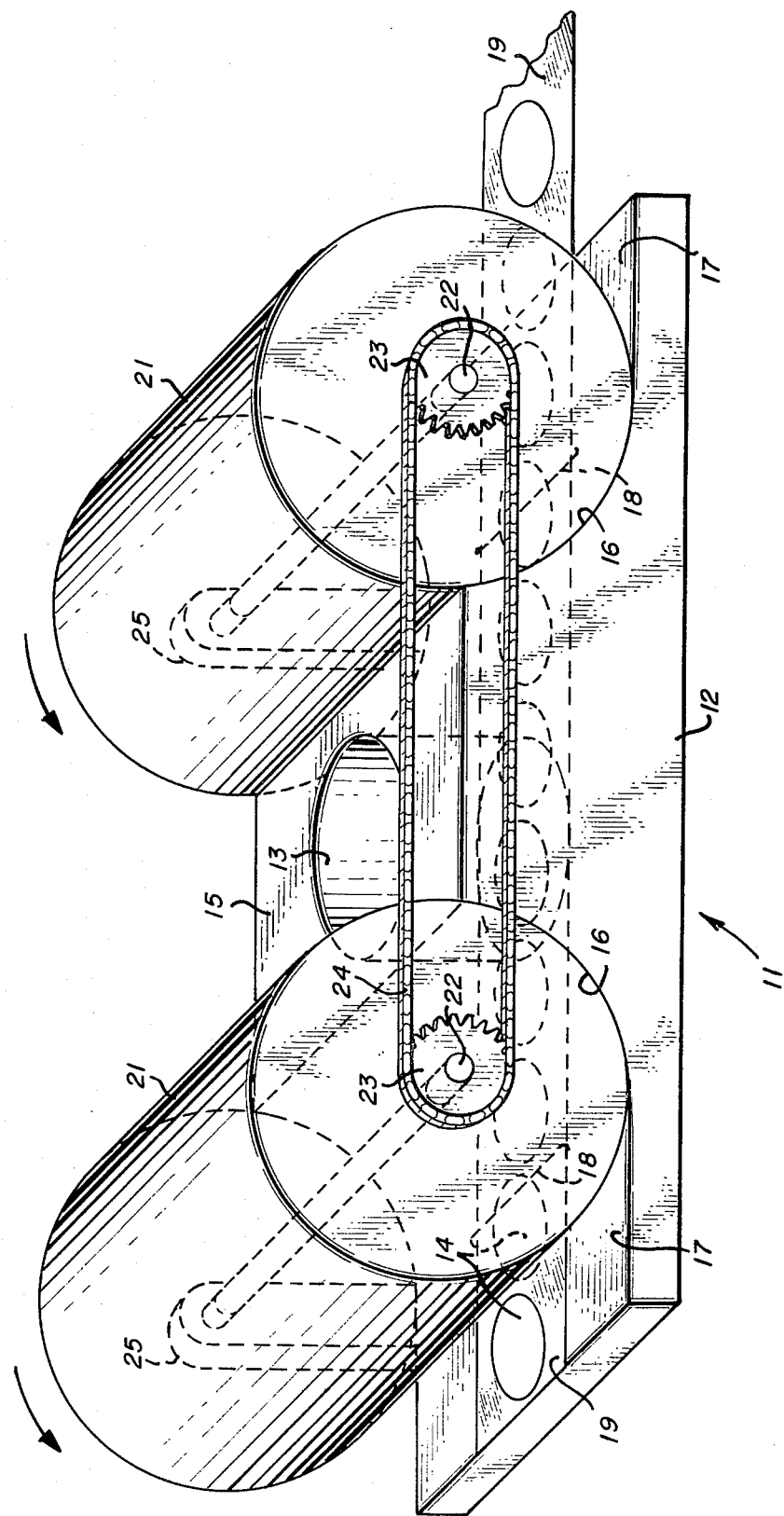

ROTARY VACUUM SEAL FOR A WAFER TRANSPORT SYSTEM

BACKGROUND OF THE INVENTION

The present invention relates in general to rotary vacuum seals for a wafer transport system employed for transporting wafers into and out of an evacuated processing station.

DESCRIPTION OF THE PRIOR ART

Heretofore, rotary vacuum seals have been employed for sealing transport systems for transporting sheets of material into an evacuated processing station.

Generally, these prior art systems have used a pair of rollers at least one of which is deformable and between which the sheet material to be processed passes in passing into and out of the evacuated processing station. Wiping blades have been provided to seal the rollers to the evacuable envelope. Examples of such rotary vacuum seals for article transport systems are found in U.S. Pat. No. 3,170,576, issued Feb. 23, 1965 and U.S. Pat. No. 3,334,908 issued Aug. 8, 1967.

The problem with these prior art systems is that they are relatively complicated requiring a number of rollers and wiper blades and it is desirable to provide a less complicated system, particularly useful for transport of frangible semiconductive wafers through an evacuated wafer processing station, such as an evaporator, sputter etch or deposit means, or chemical vapor plasma etch or depositing means.

SUMMARY OF THE PRESENT INVENTION

The principal object of the present invention is the provision of an improved rotary vacuum seal for sealing a semiconductive wafer transport system employed for transporting semiconductive wafers into and/or out of a wafer processing station.

In one feature of the present invention, the wafers to be processed pass into an evacuated wafer processing station through a slot positioned generally at the intersection of a concave and planar external face portion of the envelope and a deformable elastic roller is disposed for rolling sealing engagement with the wafers and for wiping sealing engagement with lip portions of the slotted planar and concave faces for providing a gas tight seal of the slot while permitting passage of the wafers therethrough.

In another feature of the present invention, the elastic deformable roller comprises a pneumatic roller.

In another feature of the present invention, the wafers to be processed pass into the evacuated processing station on a flexible conveyor web coated with a layer of elastomeric material which faces the broad faces of the wafers being transported.

In another feature of the present invention, the conveyor web which conveys the wafers being processed into the evacuated processing station comprises a web of mylar having a thickness falling within the range of ¼ mil to 10 mils.

In another feature of the present invention, the deformable sealing roller is driven for driving the conveyor means by frictional engagement between the roller and the adjacent surfaces of the conveyor web and wafers carried thereon, whereby a wiping action between the wafer and the deformable sealing roller is avoided in use.

Other features and advantages of the present invention will become apparent upon a perusal of the following specification taken in connection with the accompanying drawings wherein:

BRIEF DESCRIPTION OF THE DRAWING

The drawing is a perspective view of a wafer processing station incorporating the rotary seal features of the present invention.

DESCRIPTION OF THE PREFERRED EMBODIMENTS

Referring now to the drawing there is shown the rotary vacuum seal for the wafer transport system 11 incorporating features of the present invention. The wafer processing station 11 includes an evacuable envelope 12, as of aluminum, with an internal cylindrical bore 13 through which the wafers 14 are serially advanced for processing at subatmospheric pressure.

In a typical example, an ion implanter head, not shown, is mounted to the upper planar surface 15 of the evacuable envelope 12 via conventional vacuum tight sealing means, such as by seals and bolted flanges. Alternatively, an evaporator head, sputter head, or plasma chemical vapor deposition or etch head means is affixed over the cylindrical bore 13 in the evacuable envelope 12 so as to effect processing of wafers 14 advanced through the chamber 13. The head, not shown, includes a conventional vacuum pump for reducing the atmospheric pressure within the processing bore 13 to an operating pressure as of $10^{-3}$ torr to $10^{-9}$ torr, depending upon the type of wafer processing performed in the processing station 11.

The envelope 12 includes a pair of generally concave cylindrical face portions 16 on opposite sides of the processing chamber 13. Each concave face 16 intersects with a generally planar face portion 17. A narrow slot 18 is provided passing horizontally through the envelope 12 and intersecting with the central cylindrical processing bore 13. Each of the slots 18 is disposed generally at the intersection of the planar and concave face portions 17 and 16, respectively. in a typical example, the slots 18 have a height of approximately 0.030 inches and a width from 4 to 8 inches depending upon the diameter of the wafer 14 to be processed. The wafers 14 are carried upon a conveyor web 19, as of 0.003 inch thick mylar tape. The upper surface of the tape is coated with a thin coating of elastomeric material such as silicone rubber.

A pair of deformable pneumatic rollers 21 are disposed adjacent the respective concave and planar faces 17 and 16 and each one is mounted on an axle 22 for rotation about an axis of a rotation generally parallel to the elongated axis of the slot openings 18 where the slot openings intersect with the concave and planar faces 16 and 17. Also, the axes of rotation are closer to the planar and concave faces than the radius of curvature of the pneumatic rollers 21 and 22 so that the rollers are deformed and depressed in the region where the rollers 21 make contact with the planar and concave faces 17 and 16, respectively.

The rollers 21 are driven by a sprocket 23 and a chain 24 so that both rollers 21 rotate in unison. The axles 22 are journaled to support brackets 25, only two of which are shown for supporting the axles 22 from the vacuum envelope 12. A drive means, not shown serves to drive one of the axles 22 which in-turn drives both rollers 21 at the same angular velocity.

The planar faces 17 and the concave faces 16 are polished so as to provide a smooth wiping engagement with the rollers 21 as the rollers 21 rotate and wipe over the exposed planar and concave surfaces of the envelope for providing a gas tight seal for the slots 18.

In addition, the deformable rollers 21 are pressed into deforming engagement with the wafers 14 and with the conveyor tape 19 so as to provide a gas tight seal therebetween. The conveyor tape or the web 19 makes a gas tight slidable engagement with the planar surface 17 of the envelope and is pressed into firm engagement therewith by means of the roller 21. The roller 21 drives the tape 19 and the wafers through the wafer processing station 12 by frictionally gripping the wafer 14 and the exposed portion of the web 19. The elastomeric coating on the web assures a good frictional engagement between the web 19 and the wafer 14 and between the web 19 and the roller 21, such that no wiping action is obtained between the roller 21 and the respective wafer and/or conveyor web 19. Thus, the roller 21 serves to drive the wafers sequentially through the wafer processing station 12 which is operated at subatmospheric pressure, such rollers serving, in addition, for making a rotary gas tight seal of the passageway 18 through which the wafers pass between the evacuated wafer processing chamber 13 and the ambient atmosphere.

In an alternative embodiment, the conveyor web 19 is omitted and the wafers 14 are merely advanced by any one of a number of conventional wafer transport means, such as vibration, by hand, by vacuum pickup, etc., into engagement with the rotating rollers 21 which then frictionally engages the wafer and slides it through the slot on the planar face 17. The rollers 21 makes a gas tight press fit seal with the broad face of the wafer and a wiping gas tight seal with the other portions of the planar face 17 and cylindrical concave face 16 which surround the slot 18.

Similarly, the wafers 14, after processing within the station 11, are transported through an exit slot 18, into a press engagement gas tight seal with one of the rollers 21 which then slides the wafer out of the evacuated envelope.

The advantage of the rotary vacuum seal wafer transport system of the present invention is that wafers are sequentially passed through an evacuated wafer processing station 12 by means of a rotary vacuum seal which is less complex than the multiple roller systems of the prior art.

What is claimed is:

1. In a rotary vacuum sealed wafer transport system for transporting semiconductive wafers between ambient atmosphere and subatmospheric pressure within a wafer processing station:
    wafer processing station means comprising an evacuable chamber for processing therein of semiconductive wafers at subatmospheric pressure;
    said evacuable envelope of said wafer processing station means having at least one slot therein through which the wafers to be processed pass between the ambient atmosphere and the subatmospheric pressure within said processing station means;
    said evacuable envelope having an external concave face portion intersecting with a generally planar external face portion and said slot being positioned generally at the intersection of said concave and planar face portions; and
    deformable elastic roller means disposed for wiping sealing engagement with portions of said planar and concave faces of said evacuable envelope surrounding said slot for providing a gas tight seal of said slot while permitting passage of said wafers through said slot.

2. The apparatus of claim 1 including conveyor means including a web having a broad face to receive the broad faces of the wafers for transporting the wafers through said slot between said ambient atmosphere and the subatmospheric pressure within said processing station means;
    said conveyor web means riding in slideable engagement with said planar face portion of said envelope; and
    said deformable elastic roller means being disposed for rolling sealing engagement with said conveyor means and for pressing said conveyor means into sealing engagement with the planar face of said envelope for permitting passage of said conveyor means and said wafers through said slot in a gas tight manner.

3. The apparatus of claim 1 wherein said elastic deformable roller means comprises a pneumatic roller rotatable about an axis of revolution generally parallel to and axially coextensive with the elongated opening defined by the intersection of said slot with said planar and concave faces of said evacuable envelope.

4. The apparatus of claim 1 wherein said concave and planar face portions which engage said roller means in wiping engagement therewith are polished surfaces.

5. The apparatus of claim 2 wherein a broad face of said conveyor web which faces said broad faces of said wafers is coated with a layer of elastomeric material.

6. The apparatus of claim 2 wherein said conveyor means comprises a web of mylar.

7. The apparatus of claim 6 wherein said mylar web has a thickness falling within the range of ¼ mil to 10 mils.

8. The apparatus of claim 2 including means for turning said roller means for driving said conveyor means.

9. The apparatus of claim 2 including, a second slot in said evacuable envelope through which the wafers to be processed pass between ambient atmosphere and the subatmospheric pressure within said processing station means;
    said evacuable envelope having a second concave face portion intersecting with a second generally planar face portion and including a second slot through said evacuable envelope, said second slot being positioned generally at the intersection of said second concave and second planar face portions;
    said conveyor means passing through said second slot means and riding in slidable engagement with said second planar face portion of said envelope;
    second deformable elastic roller means disposed for rolling sealing engagement with said conveyor means and for wiping sealing engagement with portions of said second planar and second concave faces of said evacuable envelope for providing a gas tight seal of said second slot while permitting passage of the conveyor means and said wafers through said second slot; and
    means for driving said first and second rollers in unison for driving said conveyor web through said wafer processing station.

* * * * *